United States Patent
Sakaguchi

(10) Patent No.: US 7,351,983 B2
(45) Date of Patent: Apr. 1, 2008

(54) FOCUSED ION BEAM SYSTEM

(75) Inventor: Kiyoshi Sakaguchi, Tokyo (JP)

(73) Assignee: Jeol Ltd., Tokyo (JP)

( * ) Notice: Subject to any disclaimer, the term of this patent is extended or adjusted under 35 U.S.C. 154(b) by 313 days.

(21) Appl. No.: 11/254,551

(22) Filed: Oct. 19, 2005

(65) Prior Publication Data

US 2006/0097197 A1   May 11, 2006

(30) Foreign Application Priority Data

Oct. 19, 2004   (JP) ............................. 2004-303970

(51) Int. Cl.
*H01J 37/12* (2006.01)
(52) U.S. Cl. ............. 250/396 R; 250/398; 250/492.21; 250/492.1
(58) Field of Classification Search .......... 250/492.21, 250/492.2, 492.1, 398, 491.1, 423, 396 R
See application file for complete search history.

(56) References Cited

U.S. PATENT DOCUMENTS

| 4,457,803 A | 7/1984 | Takigawa |
| 5,149,976 A | 9/1992 | Sipma |
| 6,770,887 B2* | 8/2004 | Krivanek et al. ........ 250/396 R |
| 2003/0006377 A1* | 1/2003 | Nomura .................. 250/396 R |

FOREIGN PATENT DOCUMENTS

JP        10-199466        7/1998

OTHER PUBLICATIONS

M. Kinokuni et al., "Development of Wide Range Energy Focused Ion Beam Lithography System", *J. Vac. Sci. Technol. B* 16(4), Jul./Aug. 1998, pp. 2484-2488.

* cited by examiner

*Primary Examiner*—Jack I. Berman
*Assistant Examiner*—Michael J Logie
(74) *Attorney, Agent, or Firm*—The Webb Law Firm

(57) ABSTRACT

A focused ion beam (FIB) system has an ion beam from an ion source, a condenser lens, a current-limiting aperture, an electrostatic angular aperture control lens, an electrostatic objective lens, and a controller which controls the angular aperture control lens with a polarity with which charged particles are decelerated and the objective lens with a polarity with which the charged particles are accelerated.

5 Claims, 5 Drawing Sheets

FOCUSED ION BEAM SYSTEM

BACKGROUND OF THE INVENTION

1. Field of the Invention

The present invention relates to a focused ion beam (FIB) system of the three-lens type.

2. Description of Related Art

Many focused ion beam systems now available in the market are fundamentally equipped with two lenses: an electrostatic condenser lens for controlling the angular aperture of an ion beam and an electrostatic objective lens for focusing the ion beam onto a specimen.

On the other hand, there exist focused ion beam systems equipped with three lenses, though the number is limited.

FIGS. 4A and 4B show a focused ion beam system of the latter type. The system has an emitter 10 having a front-end portion into which a substance to be ionized is supplied, an extraction electrode 20 for extracting the particles ionized in the front-end portion of the emitter 10 as an ion beam, a condenser lens (first condenser lens) 30 for controlling the angular aperture of the extracted ion beam, a beam aligner 40 for deflecting the ion beam whose angular aperture has been controlled by the condenser lens 30, such as for alignment, a current-limiting aperture (apertured baffle) 50 for extracting an ion beam having a certain angle of radiation from the ion beam whose angular aperture has been controlled by the condenser lens 30, an electrostatic angular aperture control lens (second condenser lens 60 capable of controlling the angular aperture of the ion beam without varying the amount of current of the ion beam passed through the current-limiting aperture 50, a deflector 70 for scanning the ion beam over a specimen 90, and an electrostatic objective lens 80 for focusing the beam, whose aperture angle has been controlled by the control lens 60, onto the specimen 90. That is, this type of focused ion beam system has three lenses: electrostatic condenser lens 30 for controlling the angular aperture of the ion beam, electrostatic angular aperture control lens 60 capable of controlling the angular aperture of the ion beam without varying the amount of current of the ion beam passed through the current-limiting aperture, and electrostatic objective lens 80 for focusing the beam onto the specimen.

In a so-called two-lens type focused ion beam system of the design as described above, with respect to the beam current of the ion beam, only one current is defined in principle per inside diameter of the current-limiting aperture.

Of course, the beam current can be controlled over a considerably wide range by the excitation intensity of the condenser lens. However, there is the problem that the beam diameter deteriorates severely at other than a certain current value. Accordingly, in practical situations, the number of kinds of inside diameter of current-limiting aperture is equal to the number of definable currents.

On the other hand, the focused ion beam system of the three-lens type can control the angular aperture of the ion beam independent of the beam current. Therefore, it is possible to control the beam current over a wide range with one inside diameter of current-limiting aperture without severe deterioration of the beam diameter.

FIG. 5 shows the relation between controllable beam current and beam diameter at each of four different inside diameters #0 to #4 of current-limiting aperture. The broken lines indicate the relations regarding FIB systems of the two-lens type, while the solid lines indicate the relations regarding FIB system of the three-lens type. It can be seen from the diagram that if the beam current is controlled over a wide range in FIB systems of the two-lens type, greater deterioration of beam diameter occurs than in FIB systems of the three-lens type for the same inside diameter of current-limiting aperture. That is, where a FIB system of the three-lens type is used, more kinds of beam current can be specified than where a FIB system of the two-lens type is used. As a result, with a FIB system of the three-lens type, any arbitrary beam current can be specified in applications including micromachining employing sputtering, creation of thin film making use of deposition, maskless gas etching, and SIMS (secondary ion mass spectrometry). The throughput in these works can be expected to be enhanced drastically.

As described so far, the FIB system of the three-lens type is more advantageous than the FIB system of the two-lens type, but the actuality is that there exist only a limited number of FIB systems of the three-lens type.

It is estimated that FIB systems of the three-lens type are rarely used for the following three reasons:

1) It is more inexpensive to increase the number of current-limiting apertures that can be exchanged according to the required beam current types than to increase the number of lenses by one.

2) If the number of lenses is increased, only the number of current types available is increased. It is unlikely that the maximum resolution or maximum current density that is a measure of the performance of the FIB system is improved.

3) The user is obsessed with an idea that it is difficult to adjust the FIB instrument of the three-lens type.

Meanwhile, normal electrostatic lenses include two types: (1) deceleration-type electrostatic lens (hereinafter referred to as the deceleration-type lens) for applying a voltage to a lens electrode such that charged particles are decelerated within a lens and (2) acceleration-type electrostatic lens (hereinafter referred to as the acceleration-type lens) for applying a voltage to a lens electrode such that charged particles are accelerated within a lens.

With a FIB system with an accelerating voltage of 30 kV and equipped with a Ga-LMIS (gallium liquid metal ion source) that is a FIB system currently generally available in the market, it has been computationally confirmed that a beam diameter that is nearly half of the beam diameter where a deceleration-type objective lens is used can be obtained by using an acceleration-type objective lens.

However, most FIB systems actually available in the market use deceleration-type objective lenses. It is considered that the reasons are the following two:

1) When a FIB instrument using a deceleration-type objective lens and a FIB instrument using an acceleration-type objective lens are manufactured and experiments are performed in practice, only slight differences are found between the two types of instruments.

2) Scanning ion microscope (SIM) images obtained by a FIB instrument using a deceleration-type objective lens produce better contrast than images obtained by a FIB instrument using an acceleration-type objective lens. This phenomenon becomes more conspicuous as the current value is reduced by decreasing the diameter of the current-limiting aperture (i.e., as the resolution is increased).

Although a FIB system of the three-lens type in which the angular aperture control lens 60 (second condenser lens) has been replaced by an electrostatic aberration-correcting means has begun to be discussed in papers, this type of instrument has not yet been put on the market.

As described so far, it has been difficult in practice to yield the advantage of the FIB system of the two-lens type (i.e., even if an acceleration-type objective lens is used, aberration coefficient and beam diameter can be made smaller).

We have confirmed that in a case where an acceleration-type objective lens is used, the following problems take place unlike the case where a deceleration-type objective lens is used.

1) As the aperture diameter is reduced, the actually measured value of the beam current deviates more from the calculated value. Furthermore, where a current detector is placed below the current-limiting aperture and the angular current density is measured, as the diameter of the aperture is reduced, the measured angular current density increases disproportionately in spite of the fact that the diameter of the aperture is varied within a range in which the angular current density can be assumed to be constant.

For example, it is assumed that the current-limiting aperture (apertured baffle) is made of molybdenum, the diameter of the aperture is 20 μm, and the thickness of the aperture is 100 μm. Under these conditions, an angular current density that is nearly three times as large as the assumed value is measured. That is, in the minimum beam current region, a diameter that is considerably smaller than the diameter assumed to result in some current value is required in practice.

2) It can be seen that when the dependence of the maximum resolution on the aperture diameter is measured under the same optical conditions except for the aperture diameter, the maximum resolution has a maximum value at some aperture diameter. That is, it follows that the maximum resolution cannot be obtained at the minimum current (minimum aperture diameter). It is known that in a normal FIB system, diffraction aberration can be neglected if ion mass and accelerating voltage are taken into consideration.

The foregoing problems with the FIB system of the three-lens type cannot be explained away by the optics theory. Our earnest research on these problems has led to the discovery that the following phenomena have hindered improvement of the resolution of an acceleration-type objective lens.

1) Beam current $I_{exp}$ measured with a current detector, such as a PCD, is a superimposition of a main current ($I_p$ (probe current)) based on an ion beam from the emitter and background current ($\cong I_{bck}$). That is, the following relation holds:

$$I_{exp} = I_P + I_{bck}$$

2) The background current $I_{bck}$ arises from charged particles produced by sputtering of the ion beam which is emitted from the emitter and which irradiates the edge of the current-limiting aperture. That is, ion beam irradiation of the edge of the aperture produces a large amount of ions having lower energies as compared with the accelerating voltage from the edge.

3) Therefore, where the accelerating voltage is kept constant, the magnitude of the background current $I_{bck}$ is in proportion to the main current density $J_{ap}$ at the aperture position and to the aperture radius $r_{ap}$ of the current-limiting aperture. Furthermore, the magnitude of the background current $I_{bck}$ depends on the kind of the beam, acceleration, thickness d of the current-limiting aperture, material of the aperture, and incident angle to the aperture. The main current density $J_{ap}$ and the incident angle to the aperture are dependent on the voltage $V_{cll}$ applied to the condenser lens 30.

Where the kind of the beam and the acceleration are determined, the background current $I_{bck}$ can be given by $$I_{bck} = \epsilon \cdot J_{ap}(V_{cll}) \cdot r_{ap}$$

where $\epsilon = \epsilon$ (material, d).

The problems occurring when an acceleration-type objective lens is used as described above can be explained further as follows.

4) Most kinetic energies of charged ions produced by sputtering are considerably lower as compared with the accelerating voltage. As a result, low-energy charged particles of this kind cannot pass through a deceleration-type objective lens acting to decelerate ions. On the other hand, most of low-energy charged ions of this kind can pass through an acceleration type-objective lens acting to accelerate ions. It is considered that this is the cause of the inability to fully bring out the forecasted performance where an acceleration-type objective lens is used.

5) Where an acceleration-type objective lens is used, if the aperture diameter is reduced, the background current will increase rapidly. As a result, subtle contrast will be buried in the background current. The image would be observed as if the resolution deteriorated.

The considerations given so far lead to the conclusion that good results will be obtained by reducing $\epsilon$ so as to reduce the background current $I_{bck}$. In this case, $\epsilon$ can be reduced by reducing the thickness d of the current-limiting aperture.

We have fabricated FIB systems using acceleration-type objective lenses. The thickness d of the current-limiting aperture of one system was 100 μm. The thickness d of the other system was 10 μm. Experiments for evaluating the beam current were performed for the same conditions except for the aperture thickness d. A general acceleration-type lens was used as the aperture angle control lens of each of these FIB systems of the three-lens type.

As a result, where the thickness d was 10 μm, the calculated beam current was well in agreement with the measured value even within the minimum current range. The dependence of the angular current density on the aperture diameter disappeared. An assumed given value was derived. It was confirmed that in the case where the thickness d was 10 μm, contrast and resolution of SIM images were much higher than where the thickness d was 100 μm.

However, where the thickness d was 10 μm, it was confirmed that the current-limiting aperture chipped off near its inner wall and the diameter increased after a short time from the beam irradiation. That is, the lifetime of the aperture dropped greatly. The life was about one tenth of the life achieved where the thickness d was a normal value of about 100 μm. This has demonstrated that this instrument has no practicality.

It is considered that the considerations regarding the theoretical advantages and actual problems arising when an acceleration-type objective lens is used in a FIB system of the three-lens type are similarly applied to a FIB system using electrostatic aberration-correcting means instead of an electrostatic angular aperture control lens.

SUMMARY OF THE INVENTION

It is an object of the present invention to provide a FIB system capable of making the best use of the theoretical advantages of the three-lens type using an acceleration-type objective lens without sacrificing the life of the system.

One embodiment of the present invention which solves the foregoing problems lies in a FIB system having an ion source for producing ions, an extraction electrode for extracting an ion beam from the ion source, a condenser lens for controlling the angular aperture of the extracted ion beam, a current-limiting aperture for taking out an ion beam having a certain angle of radiation from the ion beam whose angular aperture has been controlled by the condenser lens, an electrostatic angular aperture control lens designed to be capable of controlling the angular aperture of the ion beam passed through the current-limiting aperture without varying the amount of current of the ion beam, an electrostatic objective lens for focusing the ion beam, whose angular aperture has been controlled by the electrostatic angular aperture control lens, onto a specimen, and control means for controlling the electrostatic angular aperture control lens with a polarity with which charged particles are decelerated and controlling the electrostatic objective lens with a polarity with which the charged particles are accelerated.

In this embodiment of the present invention, the ion beam is extracted from the ion source by the extraction electrode. The angular aperture of the extracted ion beam is controlled by the condenser lens. The ion beam having the certain angle of radiation is taken out from the ion beam, whose angular aperture has been controlled by the condenser lens, by the current-limiting aperture. The angular aperture of the ion beam is controlled by the electrostatic angular aperture control lens without varying the amount of current of the ion beam passed through the current-limiting aperture. The ion beam whose angular aperture has been controlled by the electrostatic angular aperture control lens is focused onto the specimen by the electrostatic objective lens.

The electrostatic angular aperture control lens located behind the current-limiting aperture is controlled with the polarity with which the charged particles are decelerated. The electrostatic objective lens is controlled with the polarity with which the charged particles are accelerated.

Preferably, the FIB system further includes deflection means for scanning the ion beam, whose angular aperture has been controlled by the electrostatic angular aperture control lens, over the specimen and image creation means for detecting secondary charged particles produced from the specimen by the scanning, and creating an image corresponding to the secondary charged particles.

Another embodiment of the present invention which solves the foregoing problems lies in a FIB system having an ion source for producing ions, an extraction electrode for extracting an ion beam from the ion source, a condenser lens for controlling the angular aperture of the extracted ion beam, a current-limiting aperture for taking out an ion beam having a certain angle of radiation from the ion beam whose angular aperture has been controlled by the condenser lens, electrostatic aberration-correcting means designed to be capable of correcting the ion beam for aberrations without varying the amount of current of the ion beam passed through the current-limiting aperture, an electrostatic objective lens for focusing the ion beam, which has been corrected for aberrations by the aberration-correcting means, onto a specimen, and control means for controlling aberration-correcting lens components of the electrostatic aberration-correcting means with a polarity with which charged particles are decelerated and controlling the electrostatic objective lens with a polarity with which the charged particles are accelerated.

In this embodiment of the present invention, the ion beam is extracted from the ion source by the extraction electrode. The angular aperture of the extracted ion beam is controlled by the condenser lens. The ion beam having the certain angle of radiation is taken out from the ion beam, whose angular aperture has been controlled by the condenser lens, by the current-limiting aperture. The ion beam is corrected for aberrations by the electrostatic aberration-correcting means without varying the amount of current of the ion beam passed through the current-limiting aperture. The ion beam that has been corrected for aberrations by the electrostatic aberration-correcting means is focused onto the specimen by the electrostatic objective lens. The electrostatic aberration-correcting means located behind the current-limiting aperture is controlled with the polarity with which charged particles are decelerated. The electrostatic objective lens is controlled with the polarity with which the charged particles are accelerated.

Preferably, the electrostatic aberration-correcting means has plural stages of deflectors for producing aberration-correcting lens components. Each stage of deflectors consists of plural deflectors. The aberration-correcting lens components of the upper side of the deflectors are controlled with the polarity with which the charged particles are decelerated.

Furthermore, preferably, the system further includes deflection means for scanning the ion beam, which has been corrected for aberrations by the electrostatic aberration-correcting means, over the specimen and image creation means for detecting secondary charged particles produced from the specimen by the scanning and creating an image corresponding to the secondary charged particles.

The invention described so far yields the following advantages.

In the FIB system according to the first embodiment of the present invention, the ion beam is extracted from the ion source by the extraction electrode. The angular aperture of the extracted ion beam is controlled by the condenser lens. The ion beam having the certain angle of radiation is taken out by the current-limiting aperture from the ion beam whose angular aperture has been controlled. The ion beam passed through the current-limiting aperture is controlled in terms of angular aperture by the electrostatic angular aperture control lens without varying the amount of current. The ion beam is focused onto the specimen by the electrostatic objective lens. At this time, the electrostatic angular aperture control lens is controlled with the polarity with which the charged particles are decelerated and so charged particles which have lower energies as compared with the accelerating voltage and which are produced in large amounts from the edge of the current-limiting aperture undergo far greater lens action from the electrostatic angular aperture control lens than the ion beam from the emitter. Consequently, these low-energy particles cannot reach the objective lens.

Therefore, the background current contained in the beam current is reduced. This permits high-contrast, high-resolution imaging which should be anticipated when an acceleration-type objective lens is used. Furthermore, it is not necessary to thin the current-limiting aperture. Consequently, it is possible to make the best use of the theoretical advantages of the three-lens type using an acceleration-type objective lens without sacrificing the life of the system.

The provision of the deflection means for scanning the ion beam, whose angular aperture has been controlled, over the specimen and the image creation means for detecting secondary charged particles produced from the specimen by the scanning and creating an image corresponding to the particles enables high-contrast, high-resolution SIM (scanning ion microscope) imaging.

In the FIB system according to the second embodiment of the present invention, the ion beam is extracted from the ion source by the extraction electrode. The angular aperture of the extracted ion beam is controlled by the condenser lens. The ion beam having the certain angle of radiation is taken out by the current-limiting aperture from the ion beam whose angular aperture has been controlled by the condenser lens. The ion beam passed through the current-limiting aperture is corrected for aberrations by the electrostatic aberration-correcting means without varying the amount of current. The ion beam is then focused onto the specimen by the electrostatic objective lens. At this time, the aberration-correcting means is controlled with the polarity with which the charged particles are decelerated and so charged particles which have lower energies as compared with the accelerating voltage and which are produced in large amounts from the edge of the current-limiting aperture undergo far greater lens action from the electrostatic aberration correcting-means than the ion beam from the emitter. In consequence, these lower-energy particles cannot reach the objective lens.

Therefore, the background current contained in the beam current is reduced. This permits high-contrast, high-resolution imaging which should be anticipated when an acceleration-type objective lens is used. In addition, it is not necessary to thin the current-limiting aperture. Hence, the best use of the theoretical advantages of the three-lens type using an acceleration-type objective lens can be made without sacrificing the life of the system.

Where the electrostatic aberration correcting-means is equipped with plural stages of deflectors to produce aberration correcting-lens components, the aberration correcting-lens components of at least the upper stage are controlled with the polarity with which the charged particles are decelerated. Consequently, the components of the charged particles produced at the edge of the current-limiting aperture cannot reach the objective lens. As a result, good results are obtained.

Furthermore, a high-contrast, high-resolution scanning ion microscope image can be derived by equipping deflection means for scanning the ion beam, which has been corrected for aberrations, over the specimen and image creation means for detecting secondary charged particles produced from the specimen by the scanning and creating an image corresponding to the particles.

Other objects and features of the invention will appear in the course of the description thereof, which follows.

DESCRIPTION OF THE PREFERRED EMBODIMENTS

The preferred embodiments of the present invention are hereinafter described in detail with reference to the accompanying drawings.

First Embodiment

Figure 1A:
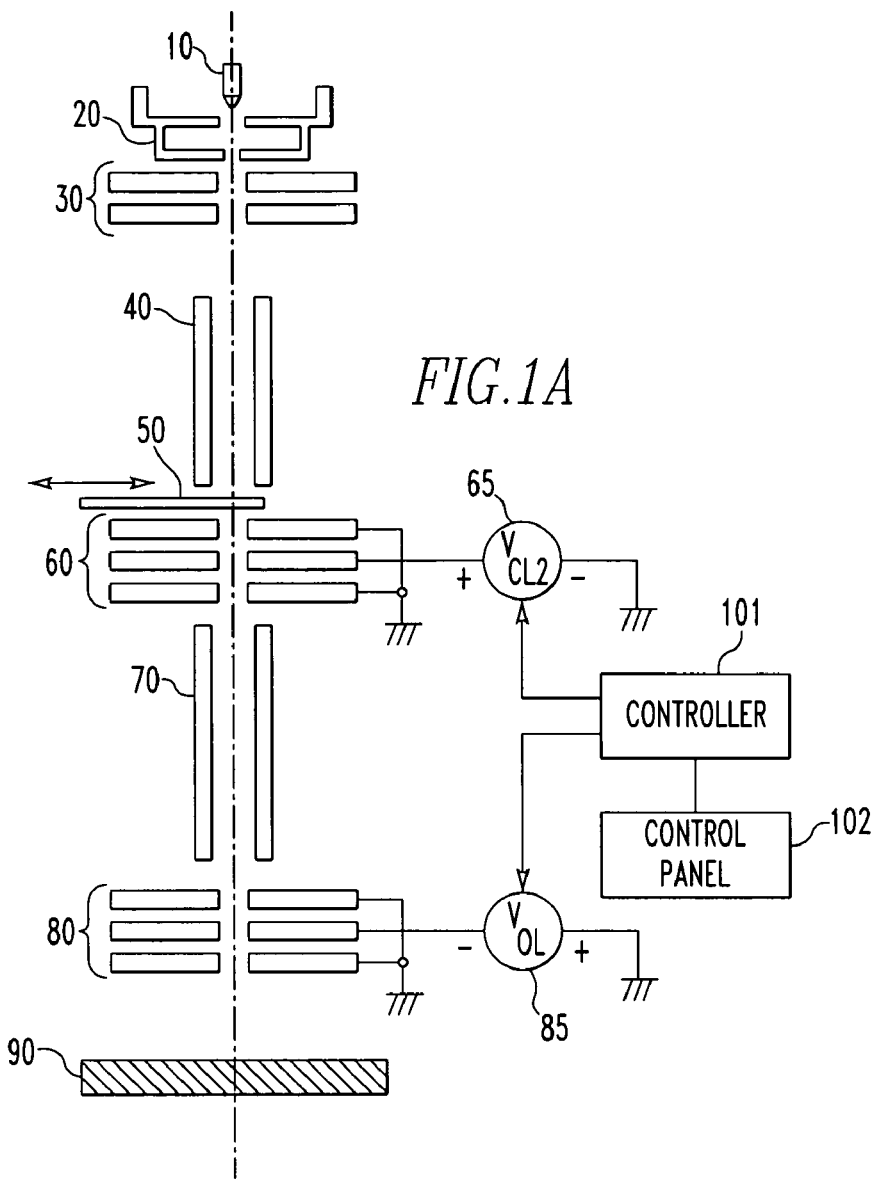
FIGS. 1A and 1B are diagrams showing the configuration of a focused ion beam (FIB) system according to a first embodiment of the present invention.
Figure 1B:
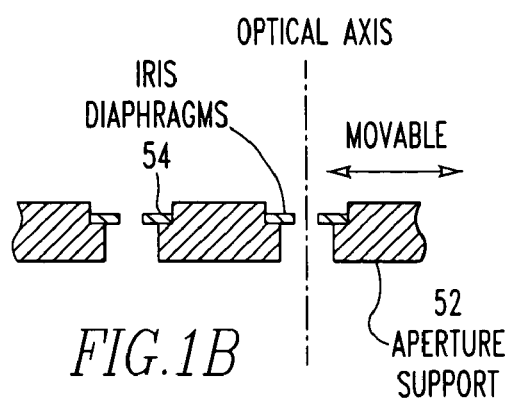

The mechanical and electrical configurations of the whole of a focused ion beam (FIB) system according to a first embodiment of the present invention is first described by referring to FIGS. 1A and 1B. In FIG. 1A, fundamental members for holding various components, such as microscope column and frame, are omitted. The illustrated FIB system is of the three-lens type.

Referring to FIG. 1A, an emitter 10 forms a main portion of an ion source (e.g., a liquid metal ion source (LMIS) or gas phase ion source (GFIS)) for producing ions. An extraction electrode 20 extracts an ion beam from the emitter 10. A condenser lens (first condenser lens) 30 controls the angular aperture of the extracted ion beam. A beam aligner 40 deflects the ion beam, whose angular aperture has been controlled by the condenser lens 30, such as for alignment of the beam. A current-limiting aperture 50 takes out an ion beam having a certain angle of radiation from the ion beam whose angular aperture has been controlled by the condenser lens 30.

The current-limiting aperture 50 is designed to be movable. As shown in FIG. 1B, plural iris diaphragms 54 having different inside diameters are mounted on aperture supports 52. The diaphragms 54 are placed into appropriate positions by a drive mechanism (not shown) such that any one of the diaphragms aligns with the optical axis. The background current $I_{bck}$ based on charged particles produced by sputtering corresponds to the thickness of the diaphragms 54. Accordingly, if the thickness is increased, the life will be increased but improvement of the performance cannot be expected. Conversely, if the thickness is reduced, improvement of the performance can be expected but the life will be shortened. In this first embodiment, therefore, good performance is obtained without thinning the diaphragms 54 as described later.

An electrostatic angular aperture control lens (second condenser lens (CL#2)) 60 is designed to control the angular aperture of the ion beam without varying the amount of current of the ion beam passed through the current-limiting aperture 50. An aperture angle control lens voltage power supply 65 applies a voltage to the angular aperture control lens 60 to control the angular aperture. The control lens 60 is controlled by the lens voltage power supply 65 with a polarity with which the charged particles are decelerated.

A deflector 70 scans the ion beam over the specimen. An electrostatic objective lens 80 focuses the ion beam, whose angular aperture has been controlled by the angular aperture control lens 60, onto the specimen 90. An objective lens voltage power supply 85 applies an objective lens voltage to the objective lens 80. The objective lens 80 is controlled by the lens voltage power supply 85 with a polarity with which the charged particles are accelerated.

A controller 101 is a control means for controlling various components of the FIB system and acts to control at least the angular aperture control lens voltage generated by the angular aperture control lens voltage power supply 65 to a decelerating polarity and to control the objective lens voltage generated by the objective lens voltage power supply 85 to an accelerating polarity. A control panel 102 acts as a control console from which the operator makes various inputs in manipulating the FIB system.

In this way, the FIB system constitutes a three-lens type FIB system equipped with the three lenses, or 30, 60, and 80. The electrostatic condenser lens 30 controls the angular aperture of the ion beam. The electrostatic angular aperture control lens 60 is designed to be able to control the angular aperture of the ion beam without varying the amount of current of the ion beam passed through the current-limiting aperture. The electrostatic objective lens 80 focuses the ion beam onto the specimen.

Figure 5:
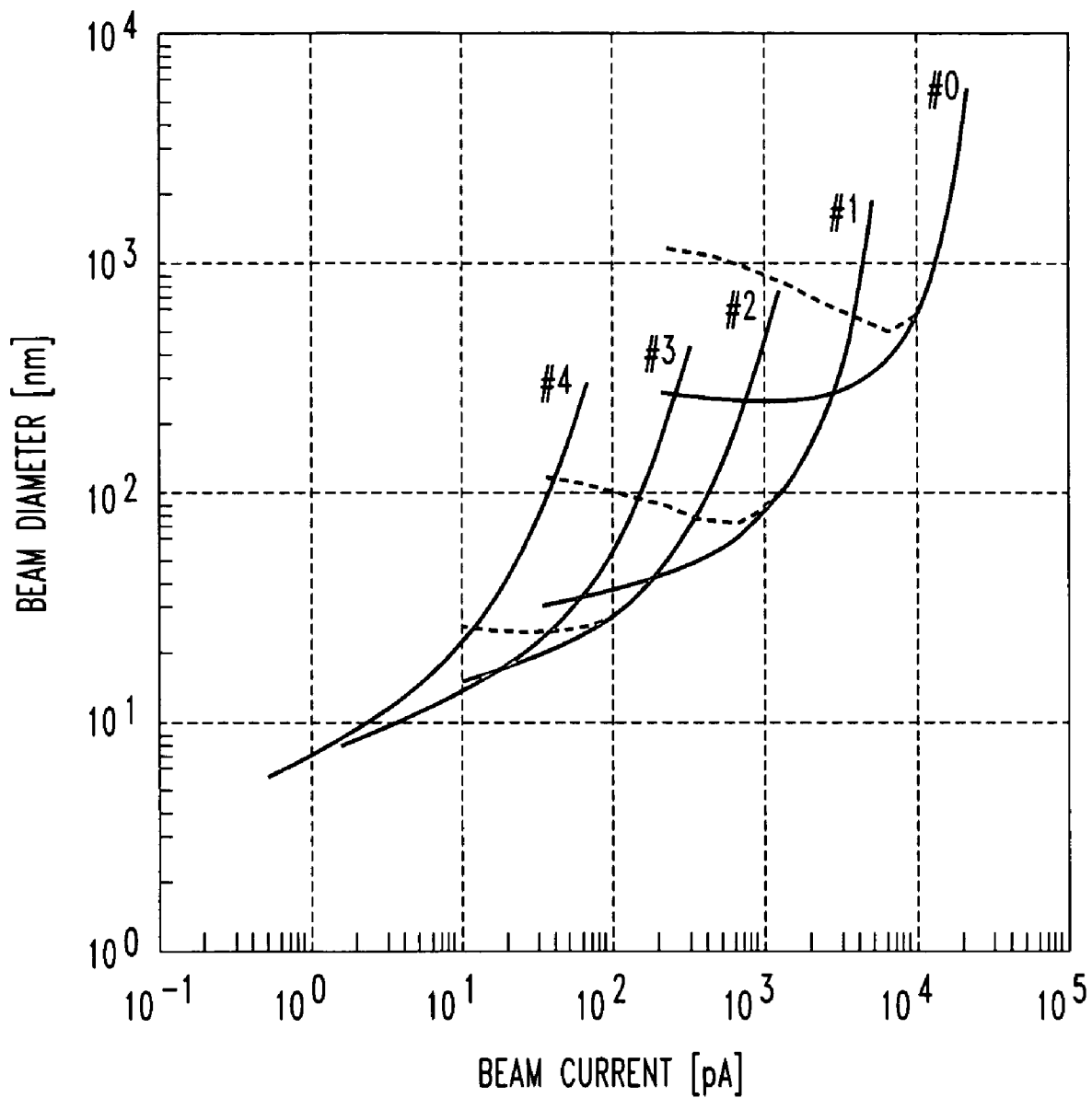
FIG. 5 is a graph in which the characteristics of FIB systems of the two-lens type and the characteristics of FIB systems of the three-lens type are compared.

Since the FIB system of the three-lens type can control the angular aperture of the ion beam regardless of the beam current, the beam current can be controlled over a wide range with one inside diameter of the current-limiting aperture without severe deterioration of the beam diameter (see FIG. 5).

These various components of the FIB system are held by a microscope column (not shown) and isolated from the outside atmosphere. The inside of the microscope column is evacuated to a high degree of vacuum by a pumping system (not shown).

The FIB system of FIGS. 1A and 1B may further include a detection means and an image creation means (none of which are shown). When the ion beam is scanned over the specimen 90 by the deflector 70, the detection means detects secondary charged particles produced from the specimen. The image creation means creates an image corresponding to the secondary charged particles. Thus, a scanning ion microscope (SIM) image can be obtained.

In this FIB system, an ion beam is extracted from the emitter 10 by the extraction electrode 20. The angular aperture of the extracted beam is controlled by the condenser lens 30.

The ion beam is deflected a given amount to a given direction by the beam aligner 40 for alignment or blanking. That is, a given angle of deflection is achieved.

An ion beam having a certain angle of radiation is taken out by the current-limiting aperture 50 from the ion beam whose angular aperture has been controlled by the condenser lens 30. With respect to the ion beam passed through the current-limiting aperture, the angular aperture is controlled by the angular aperture control lens 60 without varying the amount of current. The control lens 60 is controlled with a polarity with which the charged particles are decelerated.

Furthermore, the ion beam, whose angular aperture has been controlled by the angular aperture control lens 60, is focused onto the specimen 90 by the objective lens 80. The objective lens 80 is controlled with a polarity with which charged particles are accelerated.

The ion beam, whose angular aperture has been controlled by the angular aperture control lens 60, is scanned over the specimen 90 by the deflector 70. Secondary charged particles produced from the specimen 90 by the scanning are detected by detection means (not shown) and an image corresponding to the secondary charged particles is displayed on a display device (not shown).

Since the angular aperture control lens 60 located behind the current-limiting aperture 50 is controlled with a polarity with which the charged particles are decelerated, charged particles which have lower energies as compared with the accelerating voltage and which are produced in large amounts from the edge of the current-limiting aperture 50 by sputtering undergo much greater lens action from the angular aperture control lens 60 than the ion beam produced from the emitter 10.

Because the charged particles produced from the edge of the current-limiting aperture 50 undergo large lens action from the angular aperture control lens 60 controlled with a decelerating polarity in this way, the charged particles cannot reach the objective lens 80. On the other hand, the ion beam from the emitter 10 only undergoes normal lens action from the control lens 60 and so they can reach the objective lens 80.

Because of these actions, the background current $I_{bck}$ contained in the whole ion beam current $I_{exp}$ is reduced. Consequently, high-contrast, high-resolution imaging which should be expected when the acceleration-type objective lens 80 is used is enabled. Since it is not necessary to thin the current-limiting aperture 50, the best use of the theoretical advantages of the three-lens type using the acceleration-type objective lens 80 can be made without sacrificing the life of the FIB system.

High-contrast, high-resolution, good SIM (scanning ion microscope) imaging is enabled by scanning the ion beam over the specimen 90 by the deflector 70, detecting secondary charged particles produced from the specimen 90, and creating an image corresponding to the particles.

Accurate processing is enabled with less damage to the surrounding portions even if the current-limiting aperture 50 is made thicker than conventional and an increased number of charged particles are produced from the edge of the aperture 50, because the particles cannot reach the specimen 90.

Furthermore, if more charged particles are produced from the edge of the current-limiting aperture 50, the particles cannot reach the specimen 90 and so deterioration of SIM images and processing accuracy can be prevented. Consequently, the frequency at which the current-limiting aperture 50 is replaced can be lowered greatly by making the aperture 50 thicker than conventional. Hence, maintainability can be improved.

The diameter of the beam used in a three-lens type FIB system is dominated mostly by the Gaussian image size (system magnification) and by the chromatic aberration coefficient of the objective lens 80 at small beam currents ($I_p$) below 10 pA. On the other hand, at large beam currents ($I_p$) of more than 10 nA, the diameter is dominated by both the spherical and chromatic aberration coefficients of the condenser lens 30 and objective lens 80. As the current increases, the effects of the spherical and chromatic aberration coefficients of the condenser lens 30 increase. On the other hand, the spherical and chromatic aberration coefficients of the angular aperture control lens 60 hardly affect the beam diameter over the whole range of currents in the case where the lens is used in a weakly excited region in order to control the angular aperture alone. This means that the beam diameter is hardly affected by increases in the spherical and chromatic aberration coefficients of the angular aperture control lens 60 caused by changing the control lens 60 from acceleration to deceleration type.

Comparative experiments were performed on a prior-art example, comparative examples (#1-#2), and an embodiment of this invention. They were compared and evaluated in terms of SIM image contrast, SIM image resolution, and life of the system. The prior-art example consisted of a FIB system having an acceleration-type angular aperture control lens and a deceleration type-objective lens. The current-limiting aperture had a normal thickness of 100 µm. The comparative example #1 consisted of a FIB system having an acceleration-type angular aperture control lens and an acceleration-type objective lens 80. The current-limiting aperture had a normal thickness of 100 µm. The comparative example #2 consisted of a FIB system having an acceleration-type angular aperture control lens and an acceleration-type objective lens 80. The current-limiting aperture had a decreased thickness of 10 µm.

A FIB system having a deceleration-type angular aperture control lens, an acceleration-type objective lens 80, and a current-limiting aperture having a normal thickness of 100 µm was taken as an embodiment of the present invention. Furthermore, in these comparisons and evaluations, the states obtained by the prior-art example were taken as references. Evaluations were made based on these references. Each item was judged to be better or worse than the reference item. The results are shown in the following Table I.

TABLE I

Focused Ion Beam System

| | Prior Art Example | Comparative Example #1 | Comparative Example #2 | Embodiment |
|---|---|---|---|---|
| angular aperture control lens | | acceleration type | | deceleration type |
| objective lens | deceleration type | Acceleration type | | acceleration type |
| thickness of current-limiting aperture | 100 μm (normal thickness) | | 10 μm (decreased thickness) | 100 μm (normal thickness) |
| contrast | good ○ | deteriorated Δ | high ⊚ | high ⊚ |
| resolution | good ○ | deteriorated Δ | high ⊚ | high ⊚ |
| Life | no problems ○ | no problems ○ | extremely short X | no problems ○ |

PRIOR-ART EXAMPLE

Most of the kinetic energies of charged ions produced by sputtering are considerably lower as compared with the accelerating voltage. The angular aperture control lens is of the acceleration type but the objective lens is of the deceleration type. Therefore, charged particles produced from the edge of the current-limiting aperture cannot pass through the deceleration-type objective lens acting to decelerate ions. Consequently, the contrast and resolution are relatively good. In addition, the current-limiting aperture 50 has normal thickness. Hence, the life presents no problems.

COMPARATIVE EXAMPLE #1

Most of the kinetic energies of charged ions produced by sputtering are considerably lower as compared with the accelerating voltage. Since both angular aperture control lens and objective lens are of the acceleration type, charged particles produced from the edge of the current-limiting aperture pass through both lenses. Therefore, the background current $I_{bck}$ contained in the whole ion beam current $I_{exp}$ increases. This makes it impossible to perform high-contrast, high-resolution imaging which should be expected when an acceleration-type objective lens is used. Consequently, as the diameter of the current-limiting aperture is reduced, the contrast and resolution deteriorate. However, the life presents no problems because the aperture 50 has normal thickness.

COMPARATIVE EXAMPLE #2

Most of the kinetic energies of charged ions produced by sputtering are considerably lower as compared with the accelerating voltage. Since both angular aperture control lens and objective lens are of the acceleration type, charged particles produced from the edge of the current-limiting aperture easily pass through both lenses. However, the current-limiting aperture is thinned. This reduces the amount of charged particles produced from the edge of the current-limiting aperture. This reduces the background current $I_{bck}$ contained in the whole ion beam current $I_{exp}$. This enables high-contrast, high-resolution imaging which should be expected when an acceleration-type objective lens is used. However, since the current-limiting aperture 50 is thin, the life is extremely shortened, causing a problem in terms of practicality.

Embodiments

Most of the kinetic energies of charged ions produced by sputtering are considerably lower as compared with the accelerating voltage. The objective lens is of the acceleration type, while the angular aperture control lens is of the deceleration type. Therefore, charged particles arising from the edge of the current-limiting aperture cannot pass through the angular aperture control lens acting to decelerate ions. Consequently, the background current $I_{bck}$ contained in the whole beam current $I_{exp}$ of the ion beam decreases. This enables high-contrast, high-resolution imaging which should be expected when an acceleration-type objective lens is used. This has been confirmed also experimentally. Furthermore, the current-limiting aperture 50 has normal thickness and so no problem occurs in terms of life. That is, it has been confirmed that a FIB system capable of making the best use of the theoretical advantages of the three-lens type using an acceleration-type objective lens can be accomplished without sacrificing the life of the system.

Furthermore, where the current-limiting aperture 50 is made thicker than normal in an unillustrated manner, it has been confirmed that a longer-lived FIB system capable of making the best use of the theoretical advantages of the three-lens type using an acceleration-type objective lens can be accomplished while maintaining good contrast and resolution.

Second Embodiment

Figure 2:
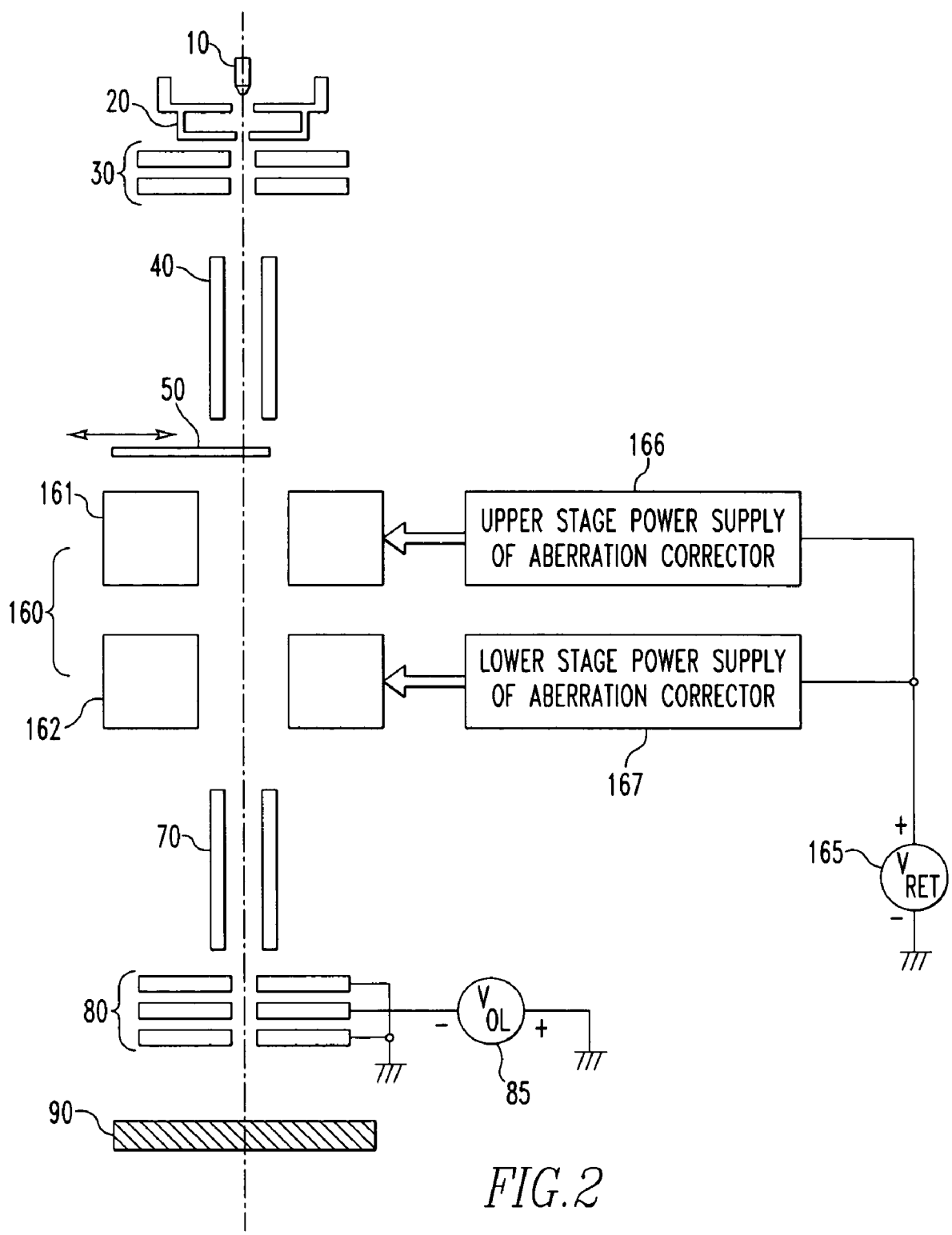
FIG. 2 is a diagram showing the configuration of a FIB system according to a second embodiment of the present invention.

The mechanical and electrical configurations of the whole FIB system according to the second embodiment is described by first referring to FIG. 2. In FIG. 2, fundamental members for holding various components, such as microscope column, and pedestal are omitted.

Shown in FIG. 2 is a FIB system of the three-lens type having a condenser lens, an aberration corrector, and an objective lens. In this case, the aberration corrector having lens components is also regarded as a lens.

An emitter 10 forms a main portion of an ion source. An extraction electrode 20 extracts an ion beam from the emitter 10. A condenser lens (first condenser lens) 30 controls the angular aperture of the extracted beam. A beam aligner 40 deflects the ion beam whose angular aperture has been controlled by the condenser lens 30, such as for alignment of the beam. A current-limiting aperture 50 takes out an ion beam having a certain angle of radiation from the ion beam whose angular aperture has been controlled by the condenser lens 30.

The current-limiting aperture 50 is designed to be movable. As shown in FIG. 1B illustrating the first embodiment, plural iris diaphragms 54 having different inside diameters are mounted on aperture supports. The diaphragms 54 are placed into appropriate positions by a drive mechanism (not shown) such that any one of the diaphragms agrees with the optical axis. The background current $I_{bck}$ based on charged particles produced by sputtering corresponds to the thickness of the diaphragms 54. Accordingly, if the thickness is increased, the life will be increased but improvement of the performance cannot be expected. Conversely, if the thickness is reduced, improvement of the performance can be expected but the life will be shortened. In this second embodiment, therefore, good performance is obtained without thinning the diaphragms 54 as described later.

An aberration corrector 160 is designed to be able to make aberration corrections by electrostatic lens components without varying the amount of current of the ion beam passed through the current-limiting aperture 50. The illustrated corrector 160 is composed of two separate portions, i.e., an upper stage portion 161 and a lower stage portion 162.

Figure 3:
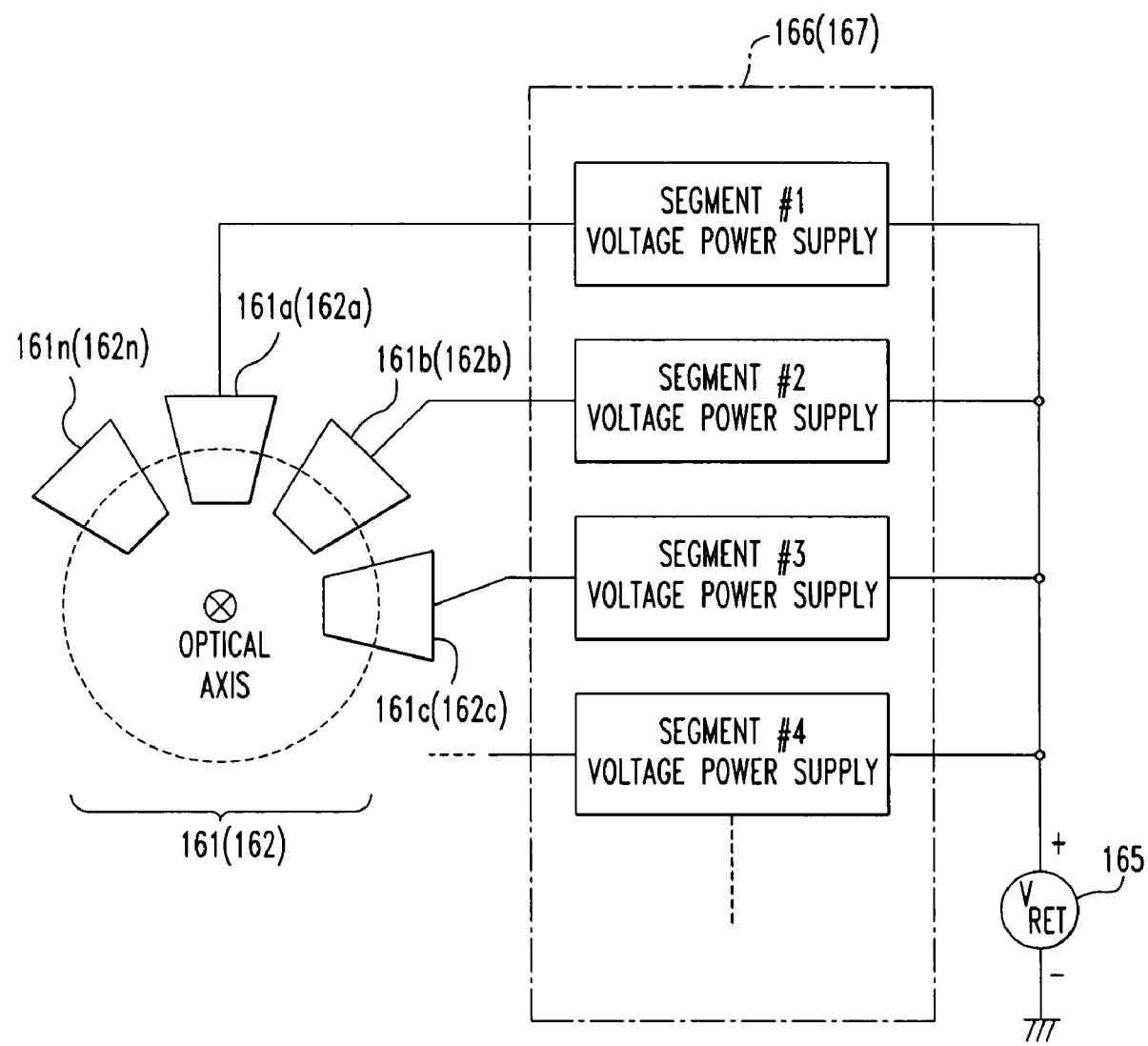
FIG. 3 is a diagram showing the configurations of portions of the FIB system according to the second embodiment of the present invention, the portions being associated with aberration correction.
Figure 4A:
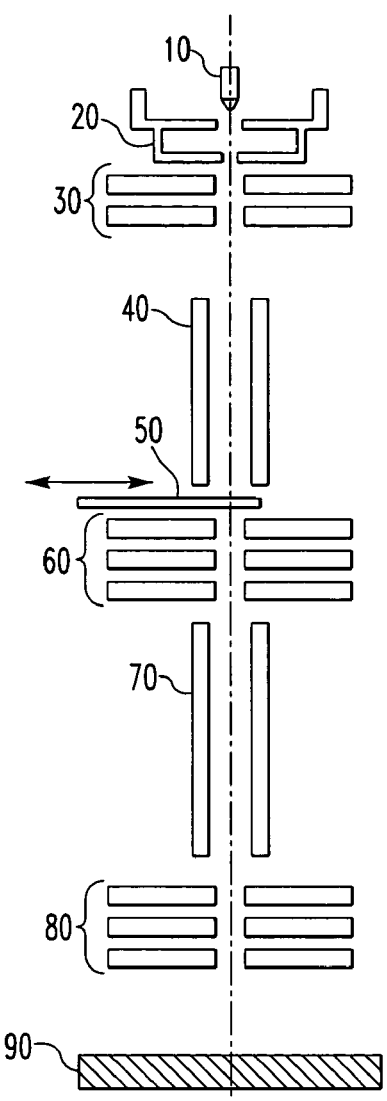
FIGS. 4A and 4B are diagrams showing the electrical configuration of the prior art FIB system.
Figure 4B:
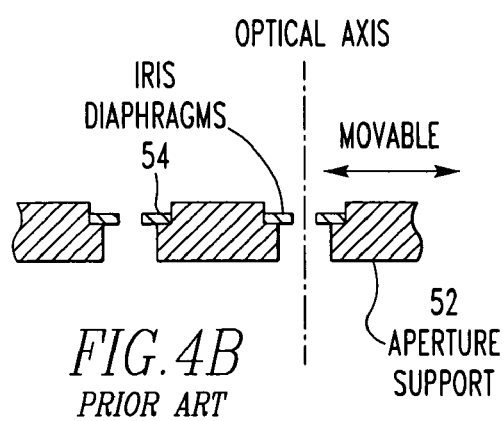

As shown in FIG. 3, the upper stage portion 161 consists of a set of deflectors including plural deflectors 161a-161n for producing aberration-correcting lens components. Similarly, the lower stage portion 162 consists of a set of deflectors including plural deflectors 162a-162n. The aberration-correcting lens components of the set of deflectors of the upper stage portion 161 are controlled with a polarity with which charged particles are decelerated.

A voltage power supply 165 applies voltages to the aberration corrector 160 to produce the aberration-correcting lens components. The aberration corrector 160 is controlled by the power supply 165 with a polarity with which charged particles are decelerated.

The ion beam is scanned over the specimen by a deflector 70. An electrostatic objective lens 80 focuses the ion beam, which has been corrected for aberrations by the aberration corrector 160, onto the specimen 90. An objective lens voltage power supply 85 applies an objective lens voltage to the objective lens 80. The objective lens 80 is controlled by the objective lens voltage power supply 85 with a polarity with which charged particles are accelerated.

A controller 101 controls the various components of the FIB system and at least acts to control the aberration-correcting lens component voltages produced by the aberration-correcting lens component voltage power supply 165 to a decelerating polarity and to control the objective lens voltage produced by the objective lens voltage power supply 85 to an accelerating polarity. A control panel 102 acts as a control console from which the operator makes various inputs in manipulating the FIB system.

In this way, the FIB system constitutes an aberration-corrected FIB system of the three-lens type equipped with the three lens components, or 30, 160, and 80. The electrostatic condenser lens 30 controls the angular aperture of the ion beam. The aberration corrector 160 is designed to be able to correct the ion beam for aberrations by electrostatic lens components without varying the amount of current of the ion beam passed through the current-limiting aperture 50. The electrostatic objective lens 80 focuses the ion beam onto the specimen.

In this FIB system, the aberration corrector has electrostatic lens components and so the system can be regarded as a three-lens type FIB system. As a result, the beam current can be controlled over a wide range with one inside diameter of the current-limiting aperture without severe deterioration of the beam diameter (see FIG. 5).

These various components of the FIB system are held by a microscope column (not shown) and isolated from the outside atmosphere. The inside of the microscope column is evacuated to a high degree of vacuum by a pumping system (not shown).

The FIB system of FIG. 2 may further include a detection means and an image creation means (none of which are shown). When the ion beam is scanned over the specimen 90 by the deflector 70, the detection means detects secondary charged particles produced from the specimen. The image creation means creates an image corresponding to the secondary charged particles. Thus, a scanning ion microscope (SIM) image can be obtained.

In this FIB system, an ion beam is extracted from the emitter 10 by the extraction electrode 20. The angular aperture of the extracted beam is controlled by the condenser lens 30.

The ion beam is deflected a given amount to a given direction by the beam aligner 40 for alignment or blanking. That is, a given angle of deflection is achieved.

An ion beam having a certain angle of radiation is taken out by the current-limiting aperture 50 from the ion beam whose angular aperture has been controlled by the condenser lens 30. With respect to the ion beam passed through the current-limiting aperture, various aberrations are corrected by the aberration corrector 160 without varying the amount of current. The aberration corrector 160 is controlled with a polarity with which charged particles are decelerated.

The ion beam that has been corrected for aberrations by the aberration corrector 160 is focused onto the specimen 90 by the objective lens 80. The objective lens 80 is controlled with a polarity with which charged particles are accelerated.

The ion beam, which has been corrected for aberrations by the aberration corrector 160, is scanned over the specimen 90 by the deflector 70. Secondary charged particles produced from the specimen 90 by the scanning are detected by detection means (not shown) and an image corresponding to the secondary charged particles is displayed on a display device (not shown).

Since the aberration corrector 160 located behind the current-limiting aperture 50 is controlled with a polarity with which the charged particles are decelerated, charged particles which have lower energies as compared with the accelerating voltage and which are produced in large amounts from the edge of the current-limiting aperture 50 by sputtering undergo much greater lens action from the aberration corrector 160 than the ion beam produced from the emitter.

Because the charged particles produced from the edge of the current-limiting aperture 50 undergo large lens action from the aberration corrector 160 controlled with a decelerating polarity in this way, the charged particles collide against a lower portion of the corrector 160 that is much longer than the angular aperture control lens 60 shown in FIGS. 1A and 1B. Here, most of the charged particles are adsorbed or absorbed and, hence, cannot pass through the corrector 160. On the other hand, the ion beam from the emitter undergoes only normal lens action from the corrector 160 and, therefore, can reach the objective lens 80.

Because of these actions, the background current $I_{bck}$ contained in the whole beam current $I_{exp}$ of the ion beam is reduced. Increases in the aberration coefficients are suppressed by using the objective lens 80 of the acceleration type. Generation of higher-order aberrations due to the aberration corrector itself can be suppressed.

High-contrast, high-resolution, good SIM (scanning ion microscope) imaging which should be achieved by an aberration-corrected FIB system is enabled by scanning the ion beam over the specimen 90 by the deflector 70, detecting secondary charged particles produced from the specimen 90, and creating an image corresponding to the particles.

In addition, it is not necessary to thin the current-limiting aperture 50. Hence, the best use of the theoretical advantages of the three-lens type using the acceleration-type objective lens 80 can be made without sacrificing the life of the aberration-corrected FIB system.

Accurate processing is enabled with less damage to the surrounding portions even if the current-limiting aperture 50 is made thicker than conventional and an increased number of charged particles are produced from the edge of the aperture 50, because the particles cannot reach the specimen 90.

Furthermore, if more charged particles are produced from the edge of the current-limiting aperture 50, the particles cannot reach the specimen 90 and so deterioration of SIM images and processing accuracy can be prevented. Consequently, the frequency at which the current-limiting aperture 50 is replaced can be lowered greatly by making the aperture 50 thicker than conventional. Hence, maintainability can be improved.

In the electrostatic aberration corrector 160 of this embodiment of the FIB system, plural (upper and lower) stages of deflectors are disposed to produce aberration-correcting lens components. Each stage of deflectors consists of plural deflectors. The aberration-correcting lens components of at least the upper stage of deflectors are controlled with a polarity with which charged particles are decelerated. In consequence, the components of the charged particles produced at the edge of the current-limiting aperture cannot reach the objective lens, producing good results.

Comparative experiments were performed on comparative examples (#1-#3) and an embodiment as described below. SIM images were compared and evaluated in terms of contrast, resolution, and system life. The comparative example #1 consisted of a FIB system having an aberration corrector having acceleration-type lens components, a deceleration-type objective lens, and a current-limiting aperture having a normal thickness of 100 µm. The comparative example #2 consisted of a FIB system having an aberration corrector having acceleration-type lens components, an acceleration-type objective lens 80, and a current-limiting aperture having a normal thickness of 100 µm. The comparative example #3 consisted of a FIB system having an aberration corrector having acceleration-type lens components, an acceleration-type objective lens 80, and a current-limiting aperture having a decreased thickness of 10 µm.

A FIB system having an aberration corrector producing deceleration-type lens components, an acceleration-type objective lens 80, and a current-limiting aperture having a normal thickness of 100 µm was taken as the embodiment. Furthermore, in these comparisons and evaluations, the states obtained by comparative example #1 were taken as references. Evaluations were made based on these references. Each item was judged to be better or worse than the reference item. The results are shown in the following Table II.

TABLE II

| | Focused Ion Beam System | | | |
|---|---|---|---|---|
| | Comparative Example #1 | Comparative Example #2 | Comparative Example #3 | Embodiment |
| aberration corrector | acceleration type | | | deceleration type |
| objective lens | deceleration type | Acceleration type | | acceleration type |
| thickness of current-limiting aperture | 100 µm (normal thickness) | | 10 µm (decreased thickness) | 100 µm (normal thickness) |
| contrast | good ◯ | deteriorated Δ | high ◉ | high ◉ |
| resolution | good ◯ | deteriorated Δ | high ◉ | high ◉ |
| Life | no problems ◯ | no problems ◯ | extremely short X | no problems ◯ |

COMPARATIVE EXAMPLE #1

Most of the kinetic energies of charged ions produced by sputtering are considerably lower as compared with the accelerating voltage. The aberration corrector forming the lens components is of the acceleration type, but the objective lens is of the deceleration type. Therefore, charged particles produced from the edge of the current-limiting aperture cannot pass through the decelerating objective lens acting to decelerate ions. Therefore, contrast and resolution are relatively good. Furthermore, the life presents no problems because the current-limiting aperture 50 has normal thickness.

COMPARATIVE EXAMPLE #2

Most of the kinetic energies of charged ions produced by sputtering are considerably lower as compared with the accelerating voltage. Since the aberration corrector producing lens components and objective lens are of the acceleration type, charged particles produced from the edge of the current-limiting aperture easily pass through both aberration corrector and objective lens. Therefore, the background current $I_{bck}$ contained in the whole ion beam current $I_{exp}$ increases. This disables high-contrast, high-resolution imaging which should be expected when an acceleration-type objective lens is used. For this reason, as the diameter of the current-limiting aperture is reduced, the contrast and resolution deteriorate. However, the life presents no problems because the current-limiting aperture 50 has normal thickness.

COMPARATIVE EXAMPLE #3

Most of the kinetic energies of charged ions produced by sputtering are considerably lower as compared with the accelerating voltage. Since both angular aperture control lens and objective lens are of the acceleration type, charged particles produced from the edge of the current-limiting aperture easily pass through both the aberration corrector and objective lens. The amount of charged particles produced from the edge of the current-limiting aperture is reduced by making the aperture thick. This reduces the background current $I_{bck}$ contained in the whole ion beam current $I_{exp}$. This enables high-contrast, high-resolution imaging which should be expected when an acceleration-type objective lens is used. However, since the current-limiting aperture 50 is thick, the life is extremely shortened, causing a problem in terms of practicality.

Embodiment

Most of the kinetic energies of charged ions produced by sputtering are considerably lower as compared with the accelerating voltage. The objective lens is of the acceleration type, while the aberration corrector producing the lens components is of the deceleration type. Therefore, charged particles produced from the edge of the current-limiting aperture cannot pass through the aberration corrector acting to decelerate ions. Consequently, the background current $I_{bck}$ contained in the whole ion beam current $I_{exp}$ decreases. This enables high-contrast, high-resolution imaging which should be expected when an acceleration-type objective lens is used. This has also been confirmed experimentally. Furthermore, the current-limiting aperture 50 has normal thickness and so no problem is caused in terms of life. That is, it has been confirmed that a FIB system capable of making the best use of the theoretical advantages of the three-lens type using an acceleration-type objective lens can be accomplished without sacrificing the life of the system.

Further, it has been confirmed that where the current-limiting aperture 50 is made thicker than normal in an unillustrated manner, a longer-lived FIB system capable of making the best use of the theoretical advantages of the three-lens type using an acceleration-type objective lens while maintaining high contrast and resolution can be achieved.

Having thus described my invention with the detail and particularity required by the Patent Laws, what is desired protected by Letters Patent is set forth in the following claims.

The invention claimed is:

1. A focused ion beam system comprising:
    an ion source for producing ions;
    an extraction electrode for extracting an ion beam from said ion source;
    a condenser lens for controlling angular aperture of the extracted ion beam;
    a current-limiting aperture for taking out an ion beam having a certain angle of radiation from said ion beam whose angular aperture has been controlled by said condenser lens;
    an electrostatic angular aperture control lens designed to be able to control the angular aperture of the ion beam passed through said current-limiting aperture without varying the amount of current of said ion beam;
    an electrostatic objective lens for focusing said ion beam, whose angular aperture has been controlled by said electrostatic angular aperture control lens, onto a specimen; and
    control means acting to control said electrostatic angular aperture control lens with a polarity with which charged particles are decelerated and to control said electrostatic objective lens with a polarity with which the charged particles are accelerated.

2. A focused ion beam system as set forth in claim 1, further including:
    deflection means for scanning the ion beam, whose angular aperture has been controlled by said electrostatic angular aperture control lens, over the specimen; and
    image creation means for detecting secondary charged particles produced from the specimen by the scanning and creating an image corresponding to the secondary charged particles.

3. A focused ion beam system comprising:
    an ion source for producing ions;
    an extraction electrode for extracting an ion beam from said ion source;
    a condenser lens for controlling angular aperture of the extracted ion beam;
    a current-limiting aperture for taking out an ion beam having a certain angle of radiation from said ion beam whose angular aperture has been controlled by said condenser lens;
    an electrostatic aberration-correcting means designed to be able to correct aberrations in the ion beam passed through said current-limiting aperture without varying the amount of current of said ion beam;
    an electrostatic objective lens for focusing said ion beam, which has been corrected for aberrations by said aberration-correcting means, onto a specimen; and
    control means acting to control aberration-correcting lens components of said electrostatic aberration-correcting means with a polarity with which charged particles are decelerated and to control said electrostatic objective lens with a polarity with which the charged particles are accelerated.

4. A focused ion beam system as set forth in claim 3, wherein said electrostatic aberration-correcting means has plural stages of deflectors for producing aberration-correcting lens components, each stage of deflectors consisting of plural deflectors, said plural stages of deflectors including an upper stage of deflectors, and wherein the aberration-correcting lens components of said upper stage of deflectors are controlled with a polarity with which charged particles are decelerated.

5. A focused ion beam system as set forth in claim 3, further including:
    deflection means for scanning the ion beam, whose angular aperture has been controlled by said electrostatic angular aperture control lens, over the specimen; and
    image creation means for detecting secondary charged particles produced from the specimen by the scanning and creating an image corresponding to the secondary charged particles.

* * * * *